United States Patent [19]

Wickstrom

[11] 4,070,690

[45] Jan. 24, 1978

[54] VMOS TRANSISTOR

[75] Inventor: Robert A. Wickstrom, Monroeville, Pa.

[73] Assignee: Westinghouse Electric Corporation, Pittsburgh, Pa.

[21] Appl. No.: 715,256

[22] Filed: Aug. 17, 1976

[51] Int. Cl.² .................. H01L 23/48; H01L 29/44; H01L 29/52

[52] U.S. Cl. ........................... 357/68; 357/22; 357/23; 357/55; 357/56

[58] Field of Search .............. 357/22, 23, 49, 54, 357/56, 65, 68, 55

[56] References Cited

U.S. PATENT DOCUMENTS

| | | | |
|---|---|---|---|
| 3,761,785 | 9/1973 | Pruniaux | 357/22 |
| 3,823,352 | 7/1974 | Pruniaux et al. | 357/56 |
| 3,851,379 | 12/1974 | Gutknecht et al. | 357/56 |
| 3,893,155 | 7/1975 | Ogiue | 357/49 |
| 3,975,221 | 8/1976 | Rodgers | 357/54 |

OTHER PUBLICATIONS

VMOS High-Speed TTL Compatible MOS Logic; by Rodgers et al., IEEE Journal of Solid State Circuits; vol. SC9, No. 5, Oct. 1974, pp. 230-250.

High Speed Epitaxial Field-Effect Devices; by Magda, vol. 14, No. 3, Aug. 1971, IBM Technical Disclosure Bulletin, p. 751.

High Speed Field-Effect Structure; IBM Technical Disclosure Bulletin, by Drangeid; vol. 11, No. 3, Aug. 1968, pp. 332-333.

IBM Technical Disclosure Bulletin, vol. 10, No. 5, Oct. 1967, pp. 653-654, by Terman et al.

Primary Examiner—Andrew J. James
Attorney, Agent, or Firm—J. B. Hinson

[57] ABSTRACT

An improved high power vertical MOS transistor is disclosed. The channel region of the transistor is electrically connected to the source terminal. The active region of the transistor comprises a plurality of finger-like mesas extending at approximately right angles from a second palm-like mesa. The finger-like mesas form the active regions of the transistor with the palm-like mesa serving as a support for the source bonding pad. Thin metallic stripes extend along the edges of the finger-like mesas to form the gate of the transistor. A metallic layer contacts the gate and extends up at least one edge and along the top of a substantially rectangular mesa. The finger-like, palm-like and rectangular mesas are supported by a common substrate. The portion of the metallic layer overlying the top of the rectangular mesa serves as the gate bonding pad. Electrical contact to the drain region of the transistor is made through the supporting substrate. A metallic layer which contacts the source region extends along the top of each of the finger-like mesas onto the top of the palm-like mesa. The portion of this layer which overlies the palm-like mesa serves as the source bonding pad. The top surface of the gate and source bonding pads are in substantially the same plane and comprise the highest points on the surface of the device.

10 Claims, 38 Drawing Figures

VMOS TRANSISTOR

BACKGROUND OF THE INVENTION

Statement Of Government Interest

The invention herein described was made in the course of or under a contract or subcontract thereunder, with the Department of the Navy, Office of Naval Research.

FIELD OF THE INVENTION

The invention relates to transistors and more particularly to high power vertical MOS transistors having gate and source bonding pads which are substantially planar with the upper surface of the transistor.

DESCRIPTION OF THE PRIOR ART

Prior art vertical MOS transistors included a Plurality of mesa-like active regions connected in parallel and supported by a substrate. These transistors are exemplified by a device disclosed in a patent application entitled "Grounded P-Substrate Vertical MOS Transistor", Ser. No. 603,707 which is assigned to the same assignee as this application. These prior art transistors are inconvenient to use due to the fact that the bonding pad for the gate is at the substrate level rather than at a level substantially equal to the upper surface of the transistor. Additionally, the capacitance between the gate terminal and the substrate was high reducing the overall performance of this device.

SUMMARY OF THE INVENTION

The disclosed transistor includes a semiconductor structure comprising a plurality of three layer finger-like elongated mesas extending at approximately right angles from a second palm-like mesa with the top, middle and bottom layers of the finger-like mesas respectively serving as the source, channel and drain of the transistor. A thin metallic layer contacts the source region and extends onto the top portion of the adjoining palm-like mesa. The source contact is bonded directly to the portion of this layer which overlies the palm-like mesa. Metallic stripes along the edge of the finger-like mesa, form the gate of the transistor. These strips are an integral part of a metallic layer which extends up one edge and along the top surface of an adjacent substantially rectangular messa which is separated from the finger-like and palm-like mesas by a valley. Connection to the gate is made by bonding directly to the portion of the metallic layer which overlies the top of the rectangular mesa. The finger-like, palm-like and rectangular mesas are supported by a common substrate. This results in a transistor in which the bonding pads for both the drain and the gate are substantially in the same plane and comprise the highest point of the transistor. This reduces many of the bonding problems experienced with prior art vertical MOS transistors. Additionally, the capacitance between the gate bonding pad and the substrate is reduced improving the overall high frequency performance of the transistor.

DETAILED DESCRIPTION

Figure 1:
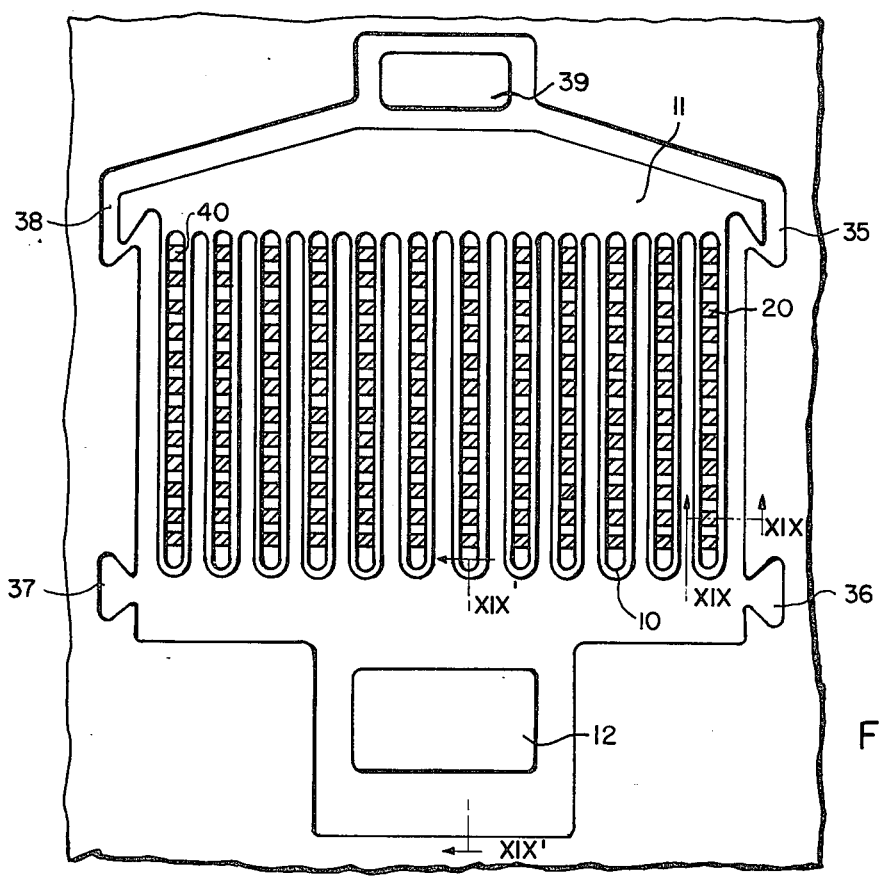
FIG. 1 is a top view of the transistor which is the subject of this invention.
Figure 18:
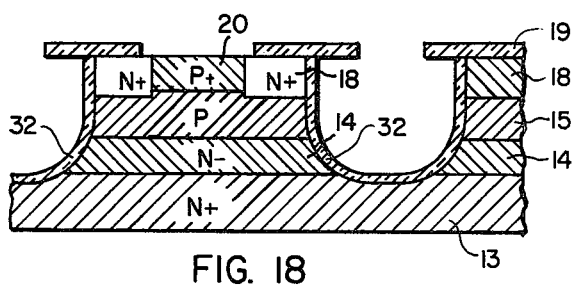
FIGS. 2 through 19 and 2' through 19' are cross-sections taken along lines XIX and XIX' illustrating the transistor at different stages of construction.
Figure 18:
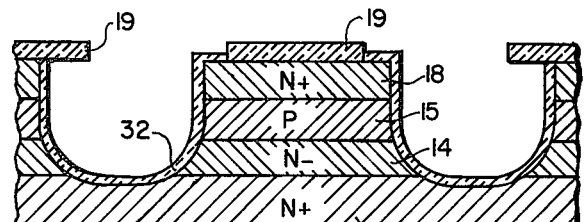
Figure 19:
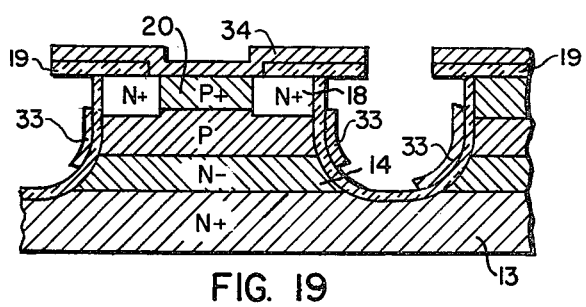
Figure 19:
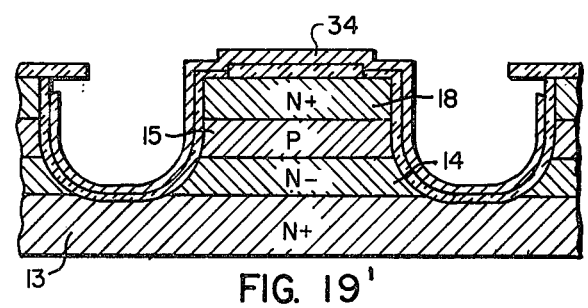
Figure 2:
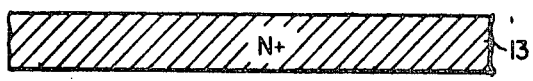
Figure 2:
Figure 3:
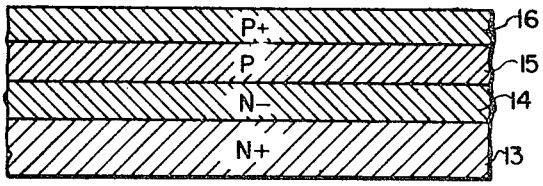
Figure 3:
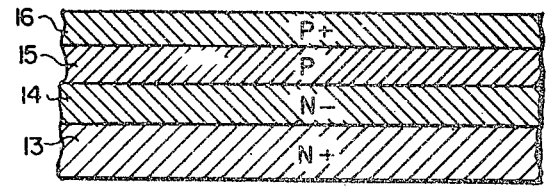

FIG. 1 is a top view of the improved vertical MOS transistor. The transistor includes a plurality of substantially identical finger-like mesa regions 10 extending from a palm like-mesa. Each of the finger-like mesas and the palm-like mesa includes three layers. The top, middle, and bottom layers of the finger-like mesas are respectively the source, channel, and drain of the transistor. These finger-like and palm-like mesas are supported by a common substrate having low electrical resistance electrical contact to the drain is through the substrate. A metallic layer in electrical contact with the top layer of each of the finger-like mesas extends onto the adjoining flat region of the palm-like mesa to form a source bonding pad 11. The sides of the finger-like mesas include a substantially vertical central portion. Metallic strips forming the gate overlie the central portion of the sides of the finger-like mesas. The metallic stripes forming the gate electrically contact a metallic layer which extends up the side and over the top of a substantially rectangular mesa which is also supported by the substrate. The portions of this metallic layer overlying the top of this mesa forms the gate bonding pad 12. The upper surface of the gate bonding pad 12 is at the same level as the source bonding pad 11. This provides convenient points for making electrical contact to the gate and source of the transistor. Electrical contact to the drain of the transistor is made through the substrate.

Each of the finger-like mesas 10 comprising the transistor illustrated in FIG. 1 are substantially identical. The processes used to form the finger-like mesas 10 also forms the palm-like mesa from which the finger-like messas 10 extend, the rectangular mesa which supports the gate bonding pad 12 and the auxiliary mesa 39. In order to fully describe the features of the transistor and the processes for constructing it, a cross section of a typical finger-like mesa and a cross section of rectangular mesa which supports the gate bonding pad 12 will be described at each stage of the construction process.

FIGS. 2 through 19 and 2' through 19' are respectively, cross-sections taken through the transistor illustrated in FIG. 1 along section lines XIX and XIX' illustrating the transistor at different stages of construction. These figures respectively illustrate cross sections through a typical finger-like mesa 10 and the rectangular mesa which supports the gate bonding pad 12. The cross section of the auxiliary mesa 39 is identical to the cross section of the mesa which supports the gate bonding pad 12.

The starting material for construction of the transistors is an N+ conductivity type substrate 13 (FIG. 2) having a resistivity of approximately 0.003 ohms per centimeter. An N− epitaxial layer 14 of approximately 1.5 microns is grown on the top surface of the substrate 13. On the upper surface of the N− epitaxial layer 14, a P conductivity type eqitaxial layer 15 of approximately 1.5 microns is grown followed by a P+ conductivity type epitaxial layer 16 of approximately 1.5 microns. These layers are uniformly grown over the entire upper surface of the substrate 13. This results in a structure illustrated in cross-sections along, section lines XIX and XIX' in FIGS. 3 and 3'.

Figure 4:
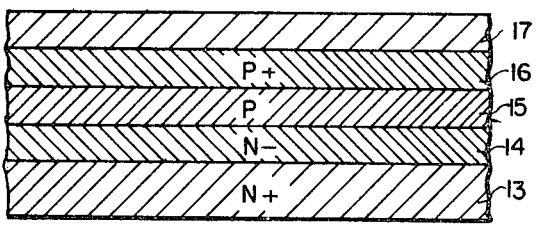
Figure 4:
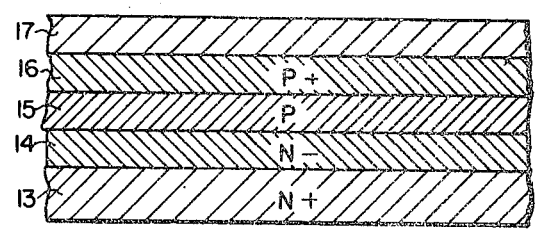

Following the formation of the epitaxial layers described above, a thin layer of silicon dioxide 17 is formed over the entire upper surface of the P+ conductivity type epitaxial layer 16. The results of this process step are illustrated in FIGS. 4 and 4'.

Figure 5:
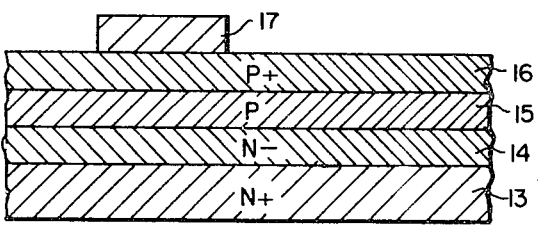
Figure 5:
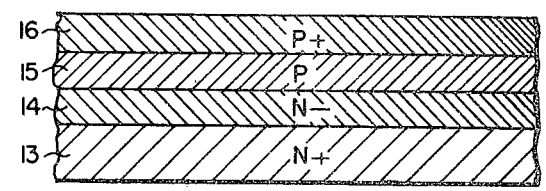
Figure 6:
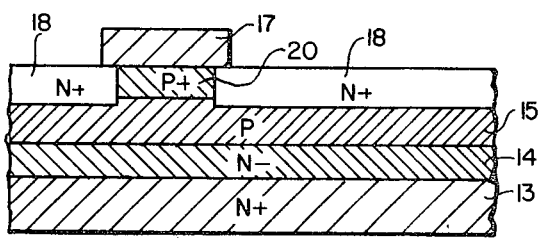
Figure 6:
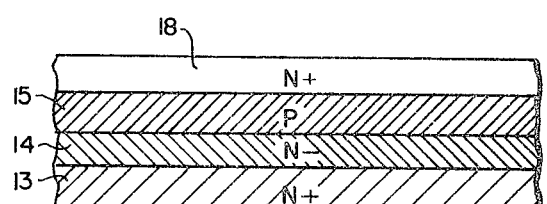

The silicon oxide layer 17 is selectively etched to remove all of this layer except the small portion illustrated in FIG. 5. The remaining portion of the silicon dioxide layer 17 is used as a mask to diffuse N conductivity type dopants into the upper surface of the unprotected portions of the P+ layer 16 to convert the unprotected portions of this layer to an N+ conductivity type region 18. Portions of the P+ region 16 which are protected by the remaining portions of the silicon oxide layer 17 form a plurality of P+ islands 20. These islands are distributed along the finger-like mesas 10. A typical P+ island 20 is shown in cross section in FIG. 6 and in top view in FIG. 1. In forming the P+ islands 20, it is necessary that the impurities be diffused entirely through the non-protected portions of the P+ layer 16 and extend slightly into the P region 15. The structure resulting from this diffusion is illustrated in FIGS. 6 and 6'.

Figure 7:
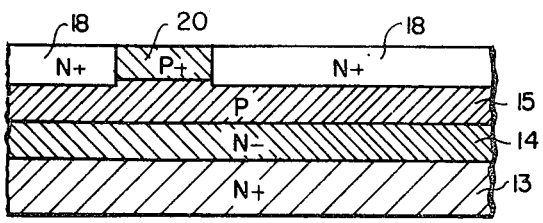
Figure 7:
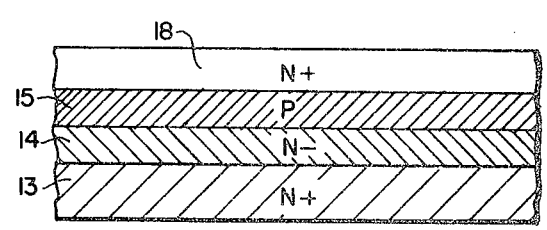

Following the diffusions to form the N+ region 18, the remaining regions of silicon oxide layer 17 are removed resulting in the structure illustrated in FIGS. 7 and 7'.

Figure 8:
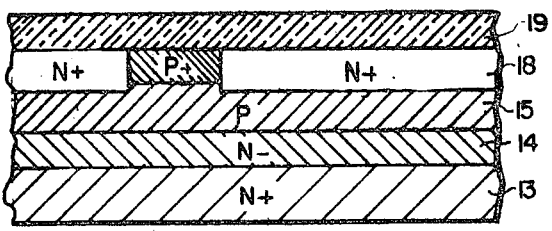
Figure 8:
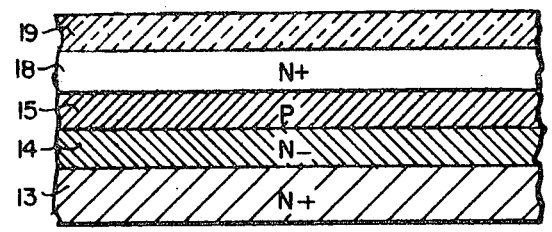
Figure 9:
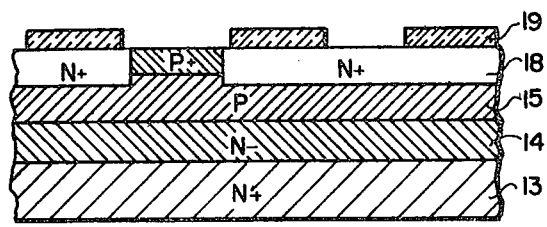
Figure 9:
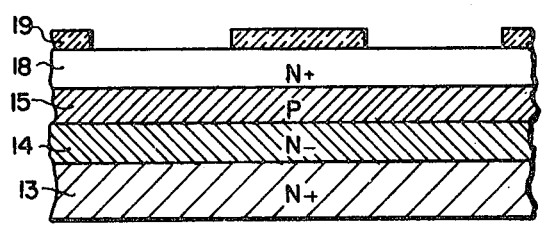
Figure 10:
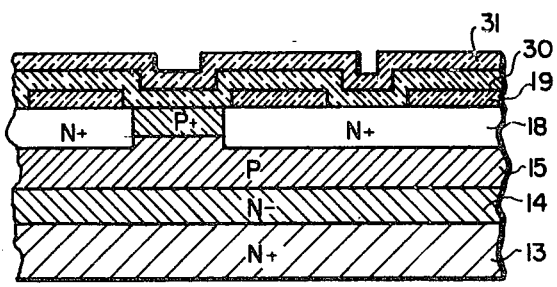
Figure 10:
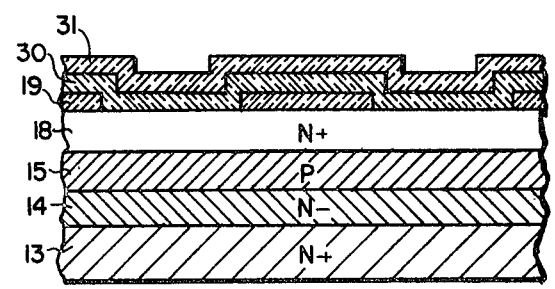

After removal of the remainder of silicon oxide layer 17, a new silicon oxide layer 19 is deposited over the entire upper surface of the structure resulting in the structure illustrated in FIGS. 8 and 8'. Silicon oxide layer 19 is coated with a photoresist layer which is exposed, developed and used as a mask to etch the silicon oxide layers 19 to produce the structure illustrated in FIGS. 9 and 9'. A silicon nitride layer 30 of approximately 1,000 Angstroms is deposited over the entire upper surface of the structure. The silicon nitride layer 31 is then covered with a second layer of silicon oxide 31 having a thickness of approximately 1,000 Angstroms. These steps result in structure illustrated in FIGS. 10 and 10'.

Figure 11:
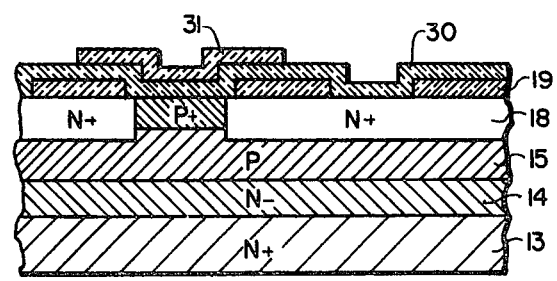
Figure 11:
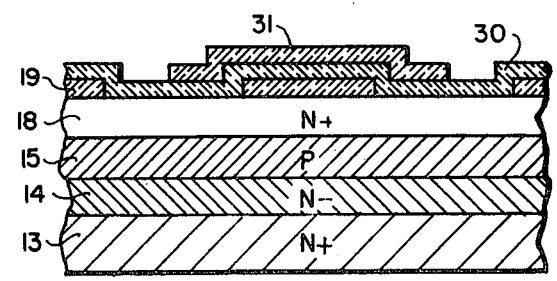
Figure 12:
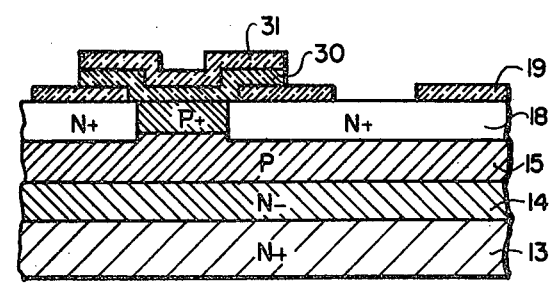
Figure 12:
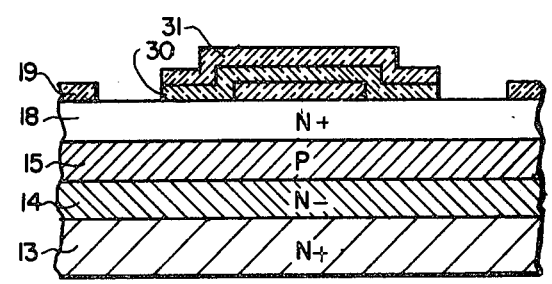
Figure 13:
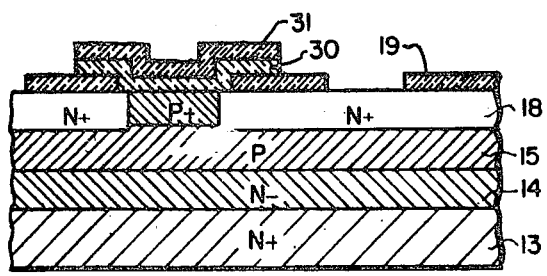
Figure 13:
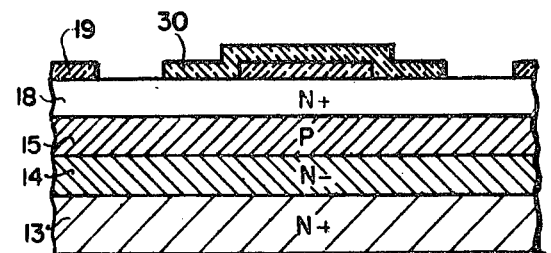

A photoresist mask is used to etch the silicon oxide layer 31 to produce the structures illustrated in FIGS. 11 and 11'. The remaining portions of the silicon oxide layer 31 are utilized as a mask to etch the exposed portions of the silicon nitride layer 30 to expose portions of the N+ region 18 as illustrated in FIGS. 12 and 12'. A second photoresist mask is used to etch the silicon oxide layer 31 to further expose the nitride layer 30 as illustrated in FIGS. 13 and 13'. FIG. 13 illustrates in cross section the portions of layers 19, 30 and 31 which remain. The remaining portions of these layers overlie areas of the semiconductor which will, after etching, become the finger-like and palm-like mesas. Similarly, FIG. 13' illustrates in cross section the remaining portions of layers 19 and 30 which overlie areas of the semiconductor which will, after etching, become the mesa which supports the gate bonding pad 12 and the auxiliary mesa 39.

Figure 14:
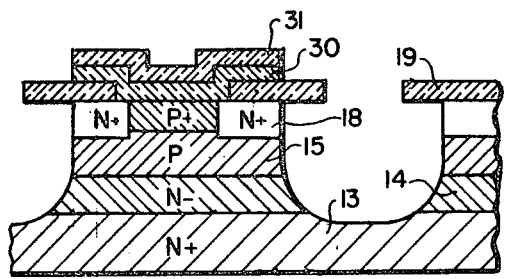
Figure 14:
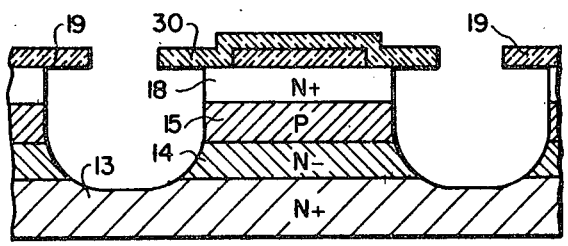
Figure 15:
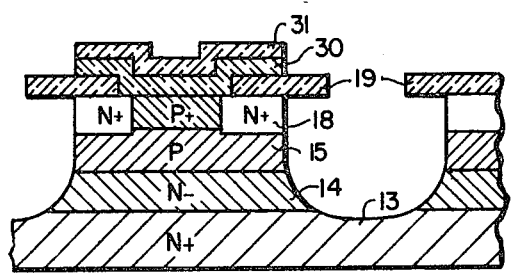
Figure 15:
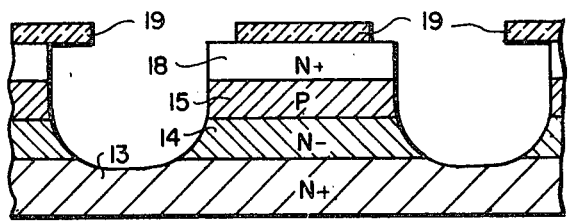

The exposed silicon is etched to selectively remove the epitaxial layers to produce the mesa-like structure illustrated in FIGS. 14 and 14'. A typical finger-like mesas is illustrated in cross-section in FIG. 14. Correspondingly, the rectangular mesa which supports the gate bonding pad is illustrated in cross section in FIG. 14'.

Figure 16:
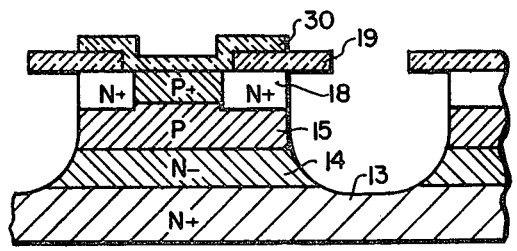
Figure 16:
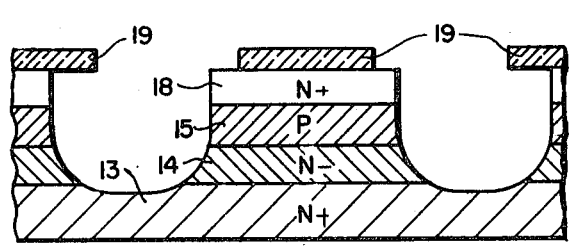
Figure 17:
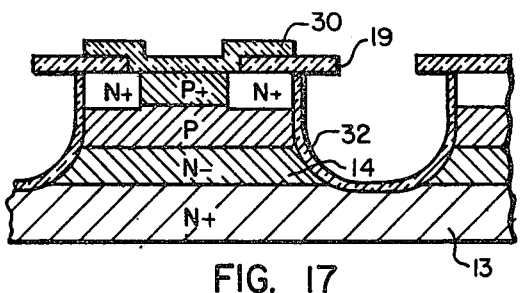
Figure 17:
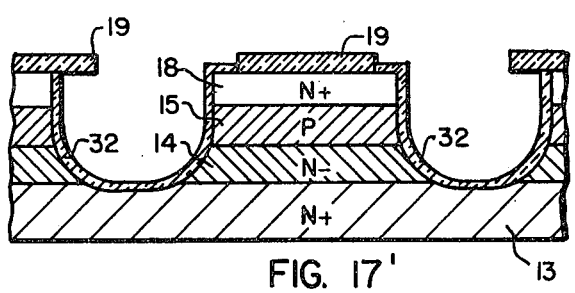

After the epitaxial layers have been etched to as discussed above, the portion of the silicon nitride layer 30 overlying the rectangular mesa illustrated in FIG. 14' and the auxiliary mesa 39 is removed followed by a second etching process to remove the portion of the silicon oxide layer 31 which overlies the finger-like mesa illustrated in FIG. 14. In removing silicon oxide layer 31 a small portion of the exposed areas of silicon oxide layer 19 will also be removed. However, silicon oxide layer 19 may be as much as ten times thicker than layer 31 permitting complete removal of layer 30 without destroying silicon oxide layer 19. Removal of the exposed portions of silicon nitride layer 30 results in the structure illustrated in FIGS. 15 and 15'. The structure after removal of the exposed portions of silicon oxide layer 31 is illustrated in FIGS. 16 and 16'.

The next step in constructing the transistor is to form an insulating layer of silicon oxide 32 approximately 900 Angstroms thick on the portions of the silicon which are exposed. This results in the structure illustrated in FIGS. 17 and 17'. The remaining portions of the silicon nitride layer 30 are removed by etching to produce the structure illustrated in FIGS. 18 and 18'.

The cross-section of the palm-like mesa supporting the source bonding pad 11 (FIG. 1) is the same as the cross-section of the typical finger-like mesa 10 discussed above except that this mesa does not contain any P+ islands. Islands of P+ conductivity type are not formed in palm-like mesa because all of the silicon oxide layer 17 (FIG. 5) overlying this region is removed before the diffusion to form the N+ region 18 is performed.

Metal is evaporated onto the surface from both the left and the right at an angle with respect to the surface. This process is fully described in U.S. Pat. No. 3,851,379 which is hereby incorporated into this application by reference. This process forms metallic gate regions 33 and the metallic layer 34 contacting the source region 18 and the P+ islands 20. The P+ islands 20 form a low electrical resistance path between the source contact and the channel region 15. This prevents the undesirable characteristics common to floating channel MOS transistors. The geometry of the upper surface of the transistor is such that the metallic gate regions 33 extend along the edge surfaces of each of the finger-like mesas 10 and along the edge and across the top of the rectangular mesa. The portion of this layer overlying the top of the rectangular mesa is the gate bonding pad 12 (FIG. 1). The portions of the silicon oxide 19 which overhang the edges of the finger-like mesas determine the width of the gate. Silicon oxide layer 19 also completely covers and overhangs the edges of the palm-like mesa supporting the source bonding pad 11. This overhang assures that the metal layer forming the source contact will not extend into the valley surrounding the palm-like mesa.

Metallic layer 34 also extends along the upper surface of each of the finger-like mesas 10 and onto the top of the palm-like mesa. The portion of this layer overlying the palm-like mesa is the source bonding pad 11. This results in source and gate bonding pads, 11 and 12, which are in substantially the same plane and the highest portion of the top surface of the transistor. The portions of N− epitaxial layer 14 which form a part of the fingerlike mesas 10 is the drain of the transistor. Electrical contact to the drain regions is through the common substrate 13.

Referring now to FIG. 1, it can be seen that the outer and inner walls of the valleys surrounding the mesas contain notch-like portions illustrated at generally reference numerals 35, 36, 37, and 38. These notches are known as isolation notches and are designed to form a break in the metallic layer forming the gate preventing it from extending into the valley surrounding the palm-like mesa supporting the source bonding pad 11. Each of the notches have the same general shape. However, the orientation of the notch differs depending on location. A typical pair of isolation notches will be described in detail with reference to FIG. 20.

Figure 20:
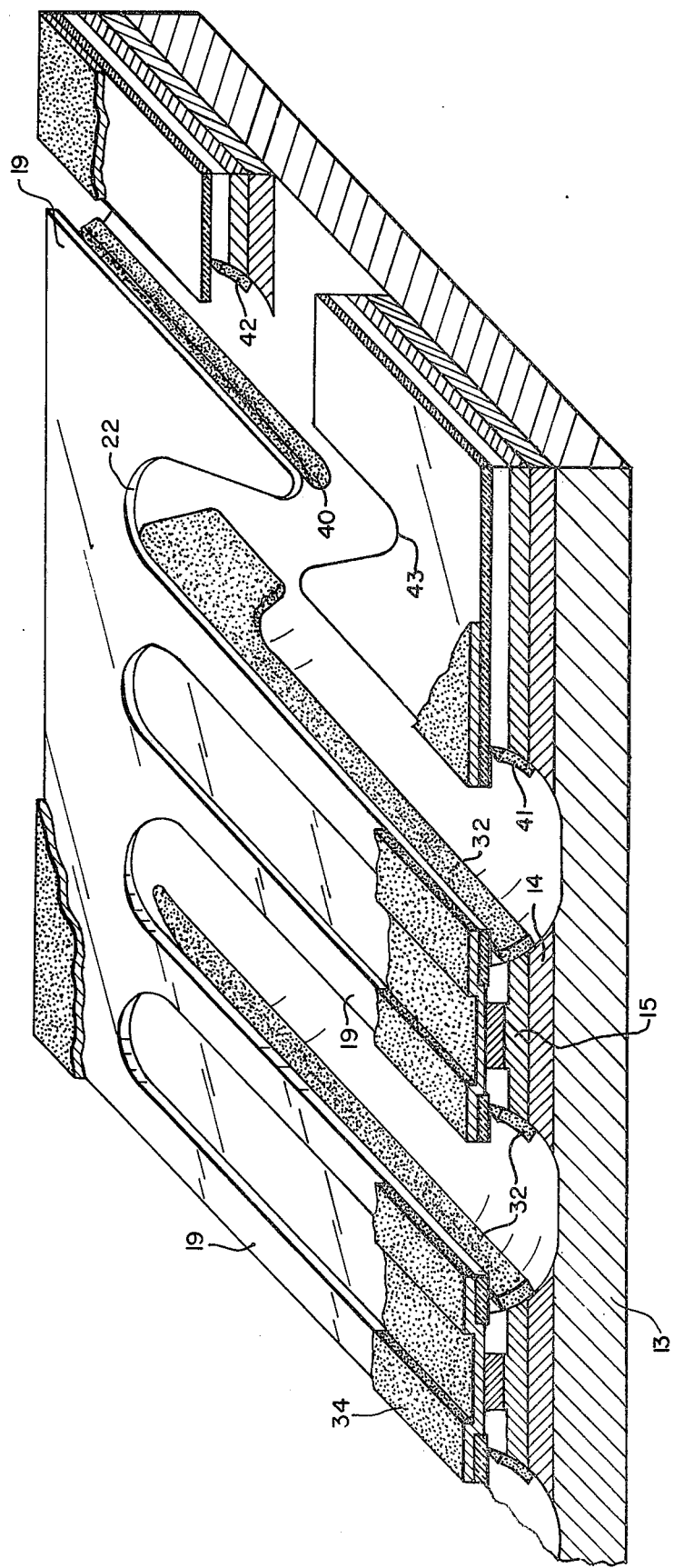
FIG. 20 is an isometric view of a portion of the transistor illustrating the insolation notches.

FIG. 20 is an isometric view of a portion of the transistor illustrated in FIG. 1 showing in detail the pair of isolation notches illustrated generally at reference numeral 35 of FIG. 1. Referring to FIG. 20, it can be seen that the overhang of the silicon oxide layer 19 in conjunction with the notch 22 is shaped such that the metallic gate 32 extend substantially to the bottom of the valley but is isolated from the metallic layer 40. Similarly, the portion of the electrical conductor 41 on the outer wall of the valley surrounding the transistor is isolated from conductor 42 by a second notch 43. These breaks are inherent in the process because the angle of evaporation prevents the metal layer from forming completely across the valley and the overhang in the silicon oxide layer 19 prevents the metallic layers from forming on the walls in the vicinity of the bottom of the notches.

FIG. 20 discussed above is a detailed view of the pair of isolation notches illustrated generally at Ref. No. 35. Isolation notches 36, 37, and 38 illustrated in FIG. 1 have the same general shape and perform identical functions. Isolation notches 36 and 37 provide for a break in the outer wall only. Notches 35 and 38 provide for a break in both the inner and outer walls.

The transistor illustrated in FIG. 1 also includes an auxiliary mesa 39 previously referred to but not discussed in detail. The cross section of this mesa is identical to the cross section of the mesa supporting the gate bonding pad 12. This mesa is also covered with a metallic layer during the formation of the other conductive layers. This layer will extend along the edges of the valley surrounding the transistor and contacts metallic strip 42 (FIG. 20). These conductive layers, if permitted to electrically float, can cause some adverse effects on the operation of the transistor due to the fact that it provides some capacitive coupling to the active regions of the transistor. This potential adverse effect is essentially eliminated by bonding a ground connection to the top surface of auxiliary mesa 39.

It is obvious that the detailed configuration of the transistor discussed above could be modified in many ways. One obvious modification would be to use two groups of finger-like mesas for the active region of the transistor with the mesa supporting the gate bonding pad being positioned between these two groups. The finger-like mesas could also be formed by preferential etching. This process would result in mesas having substantially flat sloping edges. Additionally, more than one gate bonding pad could also be used. In any of these modifications, convenient substantially planar source and gate bonding pads are provided. These bonding pads are coplanar and are at substantially the highest points of the upper surface of the transistor. Additionally, the capacitance associated with the gate regions is substantially improved over the prior art transistors thereby increasing the upper frequency limits of the device.

The improved transistor described in detail above and the modification thereto can be constructed using well known semiconductor processes. For this reason the processes utilized in constructing the transistor have not been described in detail.

I claim:

1. A transistor comprising:
   a. a substrate;
   b. a first semiconductor structure supported by said substrate, said structure including a first layer of a first conductivity type interposed between second and third layers of a second conductivity type, said first semiconductor structure including a substantially flat palm-like mesa and a plurality of finger-like mesas extending therefrom with the edges of said first, second and third layers being exposed along the edges of said finger-like mesas;
   c. a second mesa-like structure supported by said substrate and separated from said finger-like and palm-like mesas by a valley;
   d. an electrically conductive structure, electrically insulated from said first, second and third layers, selectively overlying the top, edges and valleys surrounding said second mesa-like structure and extending along the edges of said finger-like mesas to form the gate of said transistor;
   e. means for making electrical contact to said second and third layers to form a transistor wherein said first, second and third layer form the channel, source and drain of said transistor.

2. A transistor in accordance with claim 1 further including regions of said first conductivity type within said second layer, said regions of said first conductivity type forming a low electrical resistance connection between the source terminal and channel of said transistor.

3. A transistor in accordance with claim 1 wherein said first and second conductivity types are respectively P and N.

4. A transistor in accordance with claim 1 wherein said electrically conductive structure is a thin layer of aluminum.

5. A transistor comprising:
   a. a substrate;
   b. at least one mesa-like semiconductor structure supported by said substrate, said structure including a layer of a first conductivity type interposed between second and third layers of opposite conductivity type; said first, second and third layers being selectively exposed along the edges of said mesa-like structure;
   c. first electrically conductive means forming a low electrical resistance connections to said first and second layers and to at least a source bonding pad;
   d. second electrical conductive means overlying and insulated from said first layer to form the gate of said transistor;
   e. a second mesa-like structure supported by said substrate and separated from said at least one mesa-like semiconductor structure by a valley;
   f. third electrically conductive means selectively covering said second mesa-like structure and electrically contacting said third electrically conductive means to form a gate bonding pad substantially planar with said source bonding pad; and
   g. fourth electrically conductive means forming a low electrical resistance contact to said third layer to form a drain contact.

6. A transistor in accordance with claim 5 wherein said first semiconductor structure includes a plurality of mesa-like fingers extending from an adjoining palm-like mesa, said first electrically conductive means selectively covering said palm-like mesa to form said source bonding pad.

7. A transistor in accordance with claim 6 further including means for forming a low electrically resistance path between said source bonding pad and said channel region.

8. A transistor in accordance with claim 7 wherein said first and second conductivity types are respectively P and N.

9. A transistor in accordance with claim 5 wherein said first, second and third layers are epitaxial layers formed on a silicon substrate.

10. A transistor in accordance with claim 5 wherein said first, second and third layers are unified with said substrate to form a single crystal structure.

* * * * *